(12) United States Patent
Anker et al.

(10) Patent No.: US 9,673,833 B1
(45) Date of Patent: Jun. 6, 2017

(54) ALIGNING ASYNCHRONOUS SIGNALS BY TIME SHIFTING INFORMATION

(71) Applicant: Silicon Laboratories Inc., Austin, TX (US)

(72) Inventors: William J. Anker, Londonderry, NH (US); Timothy A. Monk, Hudson, NH (US); Rajesh Thirugnanam, Nashua, NH (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 15/196,707

(22) Filed: Jun. 29, 2016

(51) Int. Cl.
*H03M 1/10* (2006.01)
*H03K 3/03* (2006.01)
*H03M 1/12* (2006.01)
*H03M 1/56* (2006.01)
*H03M 1/00* (2006.01)

(52) U.S. Cl.
CPC ........ *H03M 1/1023* (2013.01); *H03K 3/0315* (2013.01); *H03M 1/00* (2013.01); *H03M 1/12* (2013.01); *H03M 1/56* (2013.01); *H03M 2201/4233* (2013.01)

(58) Field of Classification Search
CPC .. H03M 1/12; H03M 1/00; H03M 2201/4233; H03M 1/56
USPC ............... 341/120, 155, 156, 157, 166, 169; 327/159
See application file for complete search history.

(56) References Cited

U.S. PATENT DOCUMENTS

| | | |
|---|---|---|
| 9,270,288 B2 | 2/2016 | Perrott |
| 2015/0077279 A1* | 3/2015 | Song ..................... G04F 10/005 341/155 |

* cited by examiner

Primary Examiner — Joseph Lauture
(74) Attorney, Agent, or Firm — Zagorin Cave LLP

(57) ABSTRACT

Two sets of information (phase and cycle count) that are created asynchronously in a voltage controlled oscillator based analog-to-digital converter. A third set of information is created that is a delayed cycle count. The three sets of information are used to determine the proper alignment of the phase and the cycle count.

21 Claims, 4 Drawing Sheets

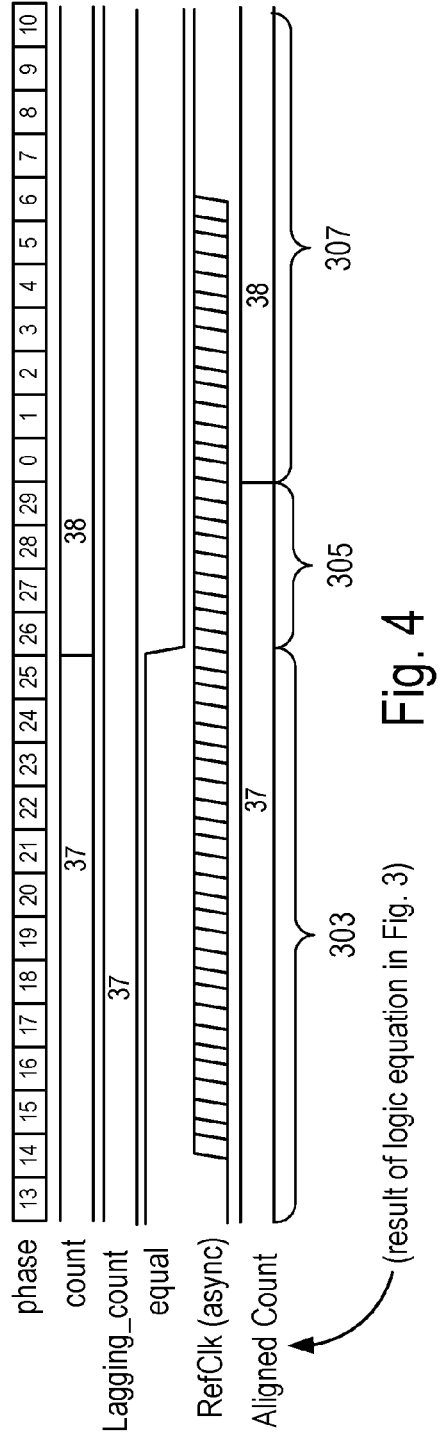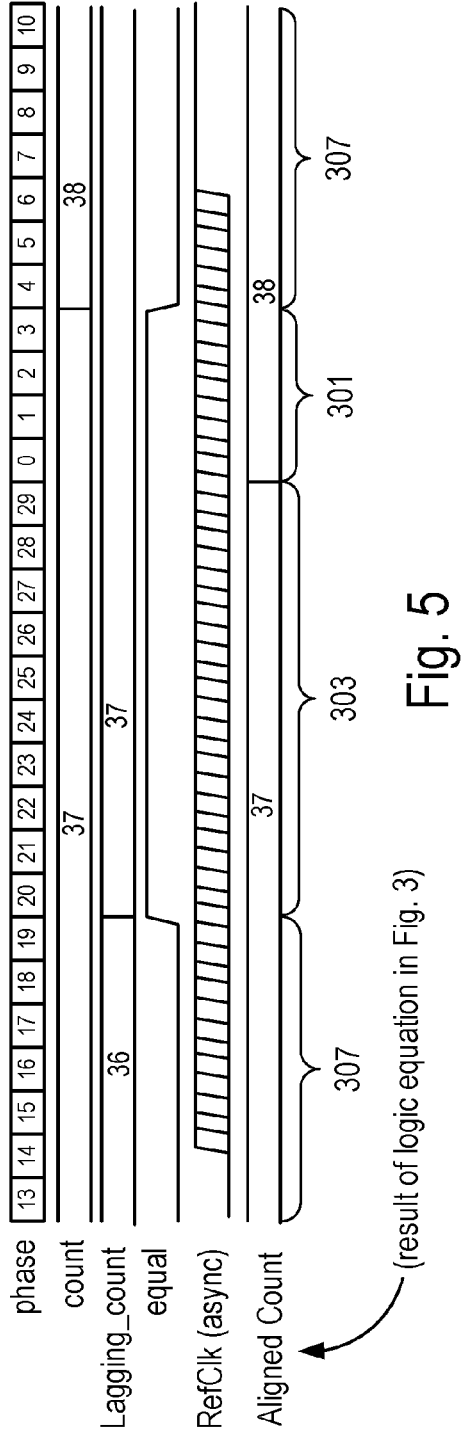

ALIGNING ASYNCHRONOUS SIGNALS BY TIME SHIFTING INFORMATION

BACKGROUND

Field of the Invention

This invention relates to aligning data across multiple asynchronous domains and more particularly to aligning information associated with an oscillator-based analog-to-digital converter.

Description of the Related Art

Analog to digital converters are used to convert analog signals to digital signals. One type of analog to digital converter is a voltage controlled oscillator (VCO)-based ADC. Achieving accurate digital conversion in a VCO-based ADC requires appropriate alignment of asynchronous signals.

SUMMARY OF EMBODIMENTS OF THE INVENTION

Accordingly, one or more embodiments described herein align two sets of information that are created asynchronously. A third set of information is created that is an out-of-phase copy of one of the original two sets of information. The three sets of information are re-clocked into another clock domain, and the three sets of information are used to determine the proper alignment of the first two sets of information.

In one embodiment, a method includes generating a count corresponding to a number of cycles of a ring oscillator. The method further includes generating a phase of the ring oscillator corresponding to a fractional cycle of the ring oscillator. A delayed count is generated that is a delayed version of the count corresponding to full cycles of the ring oscillator. The count, the phase, and the delayed count are used to determine an aligned count that is aligned with the phase.

In another embodiment, an analog to digital converter includes a ring oscillator coupled to receive an analog signal to be converted to a digital signal, the analog signal controls a frequency of oscillation of the ring oscillator. A counter supplies a count of a number of cycles of the ring oscillator. First storage stores a delayed count. Second storage stores a phase of the ring oscillator responsive to a clock signal, the phase corresponding to a fractional cycle of the ring oscillator. Alignment logic generates an aligned count based on the count, the phase, and the delayed count.

BRIEF DESCRIPTION OF THE DRAWINGS

The present invention may be better understood, and its numerous objects, features, and advantages made apparent to those skilled in the art by referencing the accompanying drawings.

FIG. 4 illustrates timing diagram associated with an embodiment of a VCO-based ADC in which the count transitions early with respect to the phase.

FIG. 5 illustrates timing diagram associated with an embodiment of a VCO-based ADC in which the count transitions late with respect to the phase.

The use of the same reference symbols in different drawings indicates similar or identical items.

DETAILED DESCRIPTION

Figure 1:
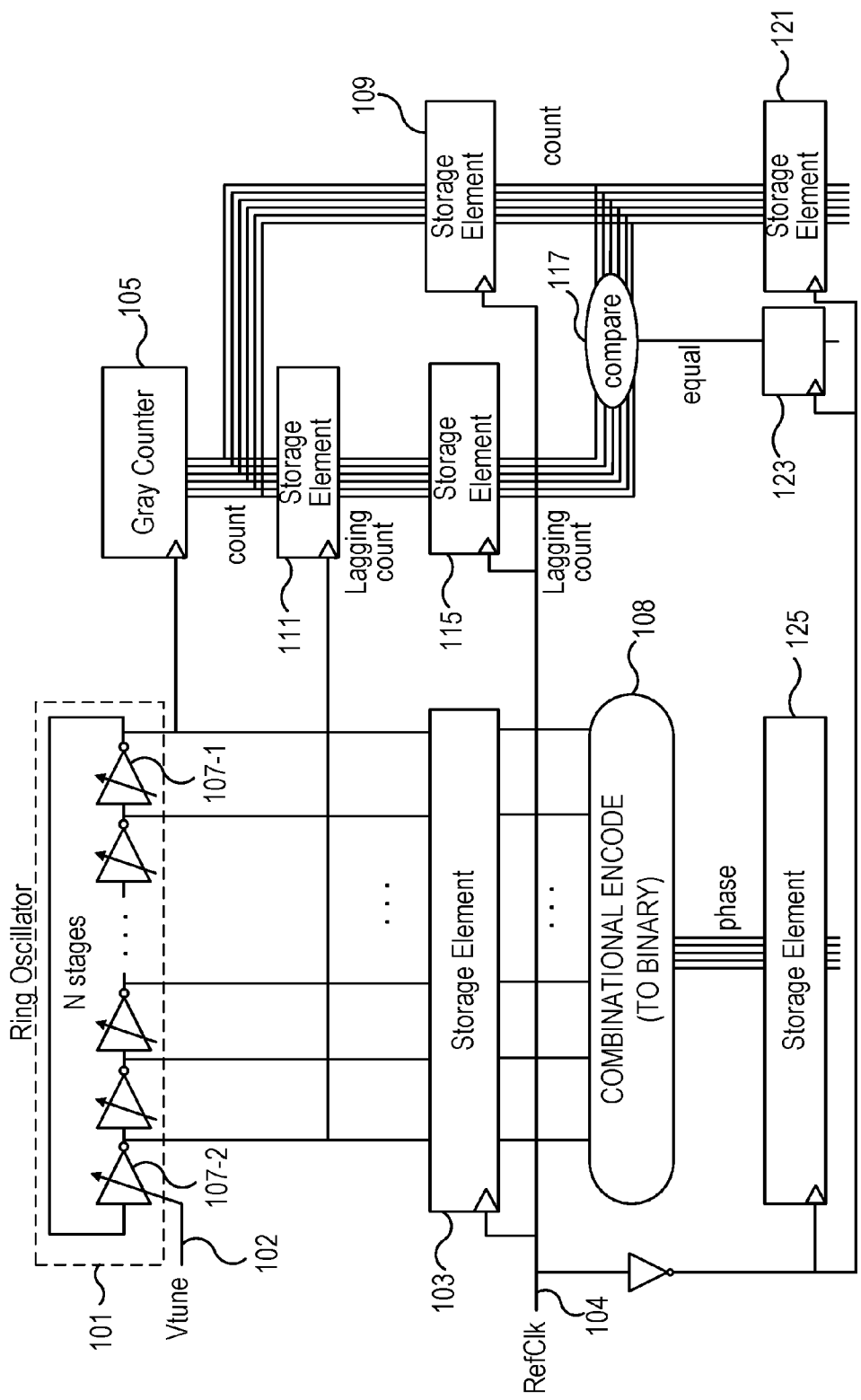
FIG. 1 illustrates aspects of a VCO-based ADC according to an embodiment.

Referring to FIG. 1, a VCO-based ADC includes a ring oscillator 101 with N inverter stages. In detail, a typical ring oscillator based ADC is made from a loop of inverters. The ring oscillator receives a voltage signal Vtune 102 that controls the speed (oscillation frequency) of the ring oscillator. The oscillation frequency increases with a higher tuning voltage and decreases with a lower tuning voltage. Thus, the frequency of the ring oscillator can be translated into a digital value that corresponds to the analog voltage signal. In one embodiment, the tuning voltage corresponds to the difference between a reference clock signal and a feedback clock signal in a phase-locked loop (PLL) but the voltage can correspond more generally to any analog voltage. Additional details relating to use of the VCO-based ADC in a PLL can be found in U.S. Pat. No. 9,270,288, which is incorporated herein by reference.

The ADC measures the speed of a ring oscillator by counting how many times the ring oscillator oscillates in a set period of time, including fractional cycles. The counter 105 increments each time the ring oscillator wraps (traverses through all the stages) and supplies a count indicating the number of times the oscillator has wrapped. Thus, e.g., when inverter 107-1 transitions from 0 to 1 counter 105 increments. In an embodiment, counter 105 is implemented as a gray counter to ensure that only one bit of the counter changes at a time. Note that the counter 105 should be sized to have a counting capacity greater than the period of the system clock (reference clock 104 in the illustrated embodiment) used to sample the counter. That allows the counter to be sampled by a system clock in an error-free way. In the embodiment shown in FIG. 1, storage element 109 samples the count information using reference clock 104.

In addition to counting the number of oscillations, the ADC captures the partial or fractional cycles completed by the ring oscillator. By the nature of how a ring oscillator oscillates, only one of the ring's inverters is changing state at a time. Thus, the data presented to the capturing storage elements 103 is naturally "thermometer coded" and that creates a sampled value by a system clock (reference clock 104) that is free of errors caused by skew. That is, the captured data does not include two oscillator stages that are simultaneously changing.

A ring oscillator with 15 stages has 30 oscillator states to fully traverse to wrap. For example, for a 15 stage ring oscillator, a "1" may walk through the stages and then a "0" will walk through the stages giving a 15 stage ring oscillator 30 possible states. The particular one of the thirty states the oscillator is in at the time of sampling corresponds to the phase of the ring oscillator. Thus, at the sampling time, the phase corresponds to which stage most recently changed state. Storage element 103 captures the phase information using the reference clock 104. In the embodiment of FIG. 1, a combinational encode circuit 108 encodes the thermometer encoded phase value in storage element 103 into a binary equivalent. Thus, e.g., the 30 states of the oscillator 101 may be converted into a five bit binary phase value. The binary phase value is then stored in storage element 125.

Capturing the phase information (fractional parts of a cycle) adds to the measurement precision by looking at the state of the individual inverters in the ring oscillator. In the ADC of FIG. 1 the data is changing at a very fast rate. The rate at which the data is changing is the delay of a single inverter, which is on the order of a one transistor delay. In any technology, measuring time in units of a single transistor delay can be challenging. The problem becomes how to capture and combine the cycle count and the fractional part, when the two sets of information are changing at the speed of an inverter flip. The skew between the two sets of data will likely be more than the rate that the data is changing.

Ideally, the phase data transition from a maximum value to a minimum at the exact same time the count increments. If there were anything but ideal alignment, we would get a count that could be correct, or, the count can be at most 1 count higher or lower than what it should be relative to the phase. So sampling will provide two sets of good data, the count and the phase, but they may not line up correctly, and, by just looking at the two sets, it is impossible to combine them to create a correct count/phase pair. Therefore, there needs to be a way to align the count and the phase.

Embodiments herein align the data across multiple asynchronous domains by creating a third set of data, which is a delayed copy of one of the sets (the count), and utilizes the three sets of data to align the first two sets of data. This comprises the third set of data to be sampled into the system clock's domain (here the reference clock 104). In an embodiment, the third set of data is created by using an inversion of the clock used by counter 105 and clocking the counter data into storage element 111 using the inverted clock. This creates a time-shifted version of the count that is lagging by roughly 180 degrees in terms of the phase. An embodiment in FIG. 1 utilizes the output of inverter 107-2 as the inverted clock, which makes the stored value in storage element 111 roughly 180 degrees lagging that of the counter 105. In another embodiment, storage element 111 is an opposite-edge sensitive storage device, as compared to the clock edge (or level) to which counter 105 is sensitive, so the same signal from inverter 107-1 that is supplied to counter 105 is also supplied to storage 111 to achieve a 180 degrees lagging effect. The lagging count data from storage element 111 is clocked into storage element 115 by reference clock 104. Note that the storage elements shown herein may be implemented as flip-flops, latches, or any other suitable storage.

Both sets of data (count and phase) are monotonically increasing. When counter 105 reaches its maximum, it rolls over to zero and continues to count. The phase tracks the current phase during the cycle and starts over at the beginning of each cycle. The oscillation count is the slowest changing of the two sets of data. In one embodiment, in the capturing clock domain (the domain of reference clock 104), the phase value is taken as correct and so the count value is aligned with the phase value by adjusting the count value. The count value may be incremented by 1, decremented by 1, or left alone depending on the phase information, the count value, and the lagging count value.

Figure 2:
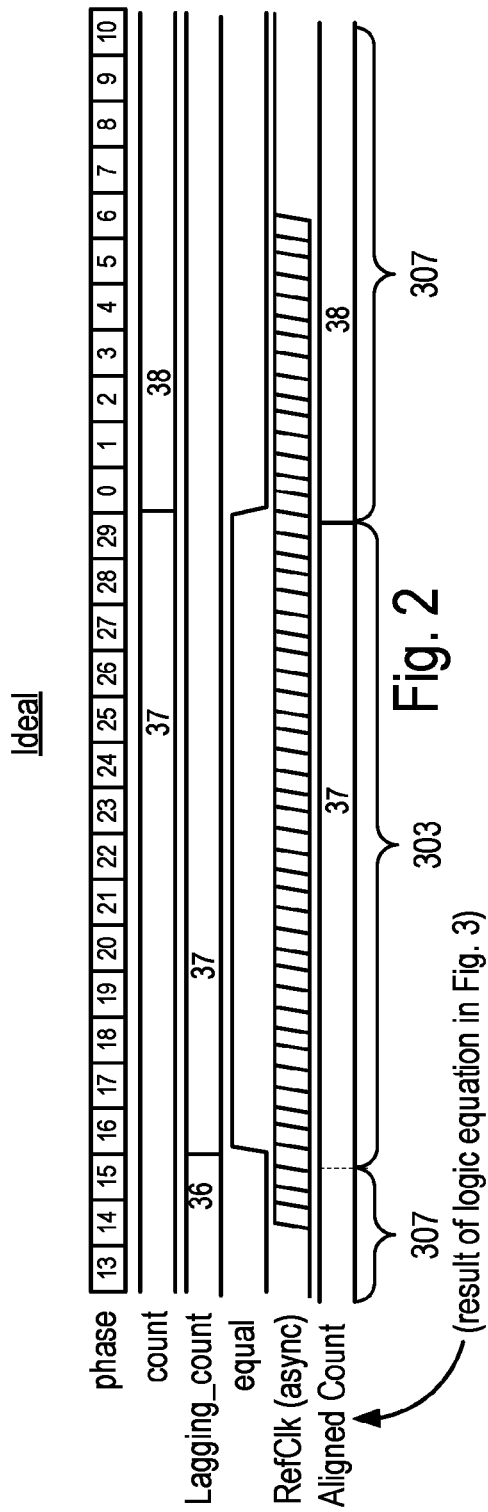
FIG. 2 illustrates timing diagram associated with an embodiment of a VCO-based ADC in which the count transitions in an ideal location with respect to the phase.

Referring to FIG. 2, the timing diagram illustrates a system with a 15 stage ring oscillator having thirty phase increments between 0 and 29. With the phase divided into 30 different increments, a phase value of 0 to 7 is approximately 0 to 90 degrees (rounded from approximately 96 degrees for ease of discussion). The phase value of 24-29 represents a phase of approximately −90 to 0 degrees (or 270 to 360 degrees). FIG. 2 illustrates the ideal transition for count and phase where the count transitions between a count of 7 and a count of 8 at the phase transition between 29 and 0, where 29 is the last phase of the cycle and 0 is the first phase. Note that the sample clock shown in FIG. 2 as RefClk (corresponding to reference clock 104) is asynchronous to the count and phase and can occur anywhere in the timing diagram of FIG. 2. The count aligned portion of the timing diagram shows the aligned count value for any time the reference clock could rise.

If the phase value is between 0 to 90 degrees (the phase value is near minimum), that means the count should have just changed. Therefore the gray counter's count should be 1 larger than the lagging count. If the count is 1 larger than the lagging count and the phase is between 0 and 90, then the count is the real count and the phase, as stated above, is presumed correct. The count and phase are considered aligned and they can be combined. If the phase value is 270 to 360 degrees, that means the counter is near incrementing, but should still match the lagging count. The lagging count was sampled approximately 180 degrees out of phase with the gray counter so if the gray counter is about to increment, the lagging count and the gray counter should be the same value. If the count matches the lagging count, the count can be used as is and combined with the phase to provide the full integer plus fractional number of cycles. Those ideal cases are shown in FIG. 2.

Note that the lagging count changes 180 degrees out of phase with the count so for the embodiment illustrated in FIG. 2, the lagging count changes after a half cycle of the 30 state ring oscillator and so the lagging count would not increment until the next transition between 15 and 16. FIG. 2, shows the most recent increment in the lagging count from 6 to 7 at the transition between 15 and 16 where the inverter 107-1 transitions from supplying a 0 to supplying a 1 causing the storage element 111 to clock in the value from counter 105.

The phase of FIG. 2 represents the phase captured in storage element 103. The count value of FIG. 2 represents the count captured in storage elements 109 and the lagging count in FIG. 2 represents the lagging count captured in storage element 115. The equal waveform of the timing diagram represents the portion of the cycle during which the count and the lagging count are equal. Logic 117 in FIG. 1 represents the compare logic to determine if the count and the lagging count are equal. In FIG. 2, equal rises at the phase value of 16 and falls after phase 29. Finally, the count alignment in FIG. 2 shows the proper count value that should be combined with the phase to provide the full integer plus fractional number of cycles.

Figure 3:
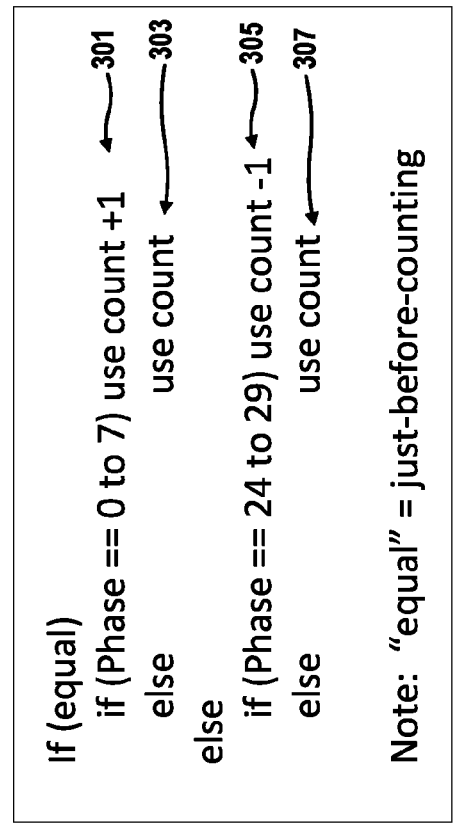
FIG. 3 shows high level code illustrating how to adjust the count to be properly aligned with the phase.

FIG. 3 illustrates example high level code for determining how to adjust the count value to be properly aligned with the phase. FIG. 2 also shows the line of code that applies to properly adjust the count value to be the aligned count value. Referring to FIGS. 2 and 3, when the count value and lagging count value are equal (from phase 16 to 29), since the phase is not between 0 and 7, code line 303 applies and the count value of 37 is used as the aligned count value. Where the count value and lagging count value are not equal (from phase 13 to 15 and from phase 0 to 10), the phase is not equal to 24-29, so the code line 307 applies and the count value (37 or 38) is used as the aligned count value.

FIG. 4 illustrates an example of the count transitioning early. If the phase value is 270 to 360 degrees (24-29), it means the counter is near incrementing, but the count should still match the lagging count. In the example of FIG. 4, the count transitions between phase 25 and 26. The lagging count transitions from a count of 36 to a count of 37 between phase 10 and 11 (not shown in FIG. 4). The lagging count and the count are equal from phase 11 to phase 25. Referring to FIGS. 3 and 5, for the portion of the diagram where the count equals the lagging count (from phase 11 to 25), the phase is not between 0 and 7, so code line 303 applies and the count value is used as the aligned count. For phase 0 to 10, the code line 307 applies (not equal and phase is not between 24 and 29) so the count value is used as the aligned count value. Finally, for the phase 26 to 29, the code line 305 applies (not equal and phase is between 24 and 29) and the aligned count value is calculated as (count −1) or (38−1)=37.

FIG. 5 illustrates an example of the count transitioning late. If the phase value is 0 to 90 degrees and the count equals the lagging count, that means that the count is behind (it is late to count) and the count should be incremented to reflect that it is late and the count plus 1 becomes the aligned count, which is then combined with the phase. In the example of FIG. 5, the count transitions between phase 3 and 4. The lagging count transitions from a count value of 36 to a count value of 37 between phase 19 and 20. The lagging count and the count are equal from phase 20 to phase 3. Referring to FIGS. 3 and 5, for the count equal lagging count portion of the code, for phase values 20-29, the phase is not between 0 and 7, so code line 303 applies and the count value (37) is used for phase 20 to 29. For phase values 0 to 3, the count and lagging count values are still equal, so code line 301 applies and the aligned count value is calculated as (count+1) or (37+1). For phase 13 to 19 and 4 to 10, the code line 307 applies and the count value is used as the aligned count value (37 for phase 13 to 19 and 38 for phase 4 to 10).

Note that the count values of 36, 37, and 38 used in FIGS. 2, 4, and 5 are simply examples and could be any consecutive count values. The architecture as presented in the embodiments described herein is limited to +/−90 degrees of an oscillator cycle. Therefore, if the phase value is between 90 degrees and 270 degrees, the count is used as is, since the skew should be less than +/−90 degrees. Note that other embodiments may use other trip points other than +/−90 degrees, such as +/−30 degrees.

Figure 6:
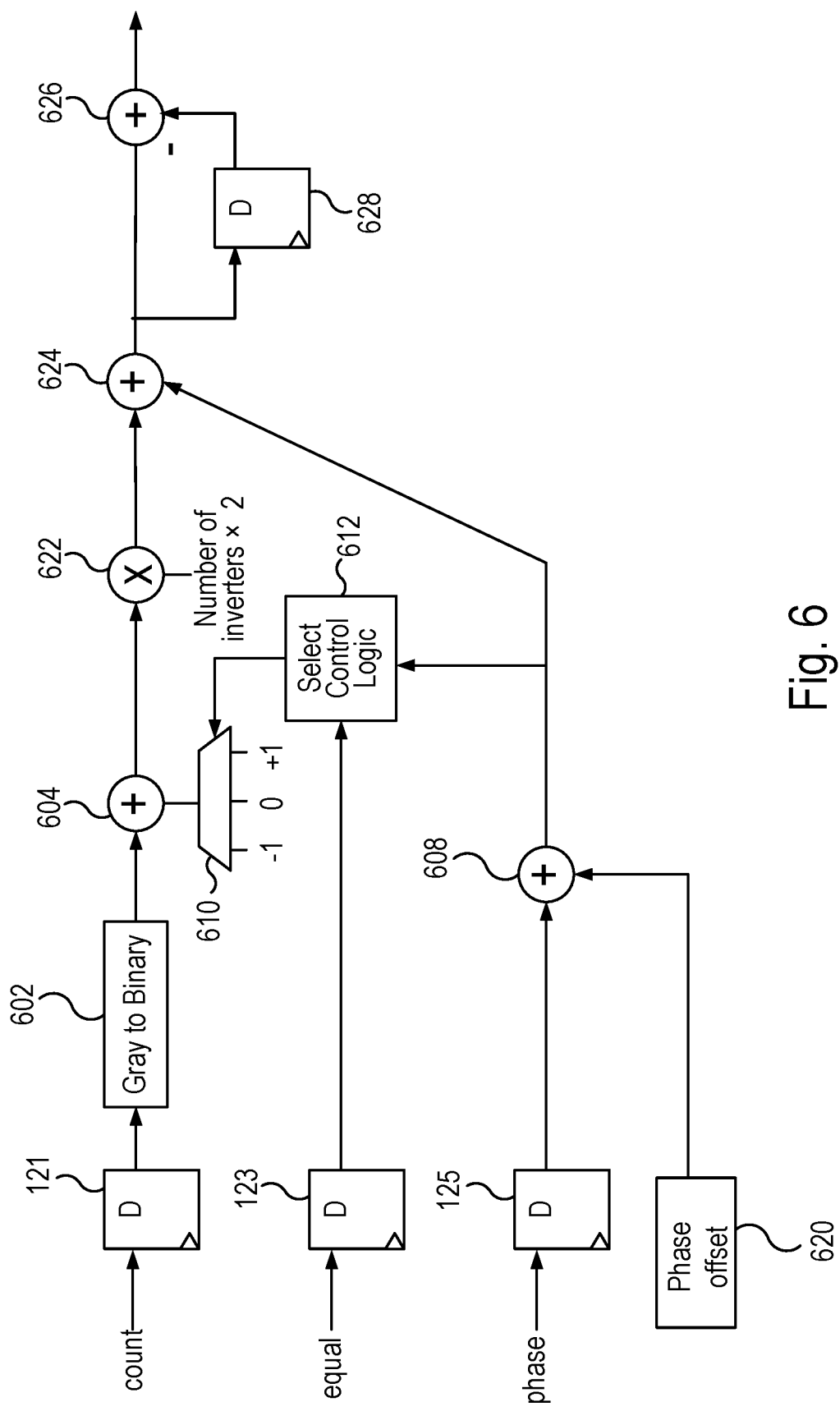
FIG. 6 illustrates an embodiment of digital processing portions of a VCO-based ADC.

FIG. 6 illustrates an embodiment of digital portions of the ADC. Storage element 121 receives the count. Storage element 123 receives the result of the compare operation (equal) and storage element 125 receives the phase information. In the embodiment illustrated in FIG. 1, the storage elements 121, 123, and 125 are clocked by an inverted version of the reference clock. In other embodiments, a full reference clock cycle may be used between the sampled phase, count, and lagging count and the digital processing portion of the logic. The gray coded count value is converted to a binary count value in the gray to binary logic 602 and supplied to summer 604. The summer 604 either adds one, subtracts one, or leaves the count value unchanged according to the value supplied by selector 610 and supplies the aligned count value. The multiplexer select signal is controlled by the select control logic 612. The combination of the summer 604, select logic 610, and control logic 612 provides alignment logic operates in accordance with the software logic shown in FIG. 3 to generate the aligned count value. The digital logic shown in FIG. 3 may be implemented, e.g., as discrete logic or as part of a programmed microcontroller, or as any appropriate combination of logic and programmed microcontroller. The select control logic 612 also receives the phase value as required by the high level code of FIG. 3.

In an embodiment, a phase offset may be utilized to center the ±90° range of the alignment in a desired location. For example, the phase offset may be used if testing shows that the count transitions consistently around the phase transition of 20 to 21. An offset may then be stored in non-volatile memory 620 with a value of 9 so the phase transition is adjusted by adding the offset to the sampled phase in summer 608 so the adjusted phase occurs between phase 29 and 0 as shown in the ideal case of FIG. 2. If testing shows that the ±90° range of the alignment in properly centered and therefore a phase offset is not necessary, a value of zero may be stored in the phase offset memory 620.

The aligned count value supplied by summer 604 is then multiplied by the number of inverters ×2 in multiplier 622. That allows the number of oscillations during the sample period to be converted to oscillator states during the sample period. The oscillator states from multiplier 622 and the phase value, adjusted by any offset, are summed in summer 624. That serves to combine the count and phase. That is the total count of oscillator states during the sample period. As previously noted, the count value monotonically increases and rolls over to zero when the count reaches the maximum and continues counting. Therefore, the logic computes the real count value as the difference between two successive readings. Thus, to determine the portion of the count attributable to a particular sample period, the subtraction circuit 626 subtracts the previous count of the number of oscillator states traversed that is stored in storage element 628 to determine the count of oscillator states that occurred during the sample period. The result of that subtraction provides the digital value that corresponds to the analog voltage 102 (see FIG. 1) that is being converted to digital. The total count of oscillator states during the sample period from summer 624 is stored in storage 628 for use with the next sample.

The approach described herein removes skew issues. There is no "fast timing" to deal with. The approach is more area efficient and energy efficient than multiple counter techniques, or, techniques which require larger/faster counters which are double clocked by the ring oscillator.

Thus, various aspects have been described relating to aligning asynchronous signals by time shifting information. The description of the invention set forth herein is illustrative, and is not intended to limit the scope of the invention as set forth in the following claims. Other variations and modifications of the embodiments disclosed herein, may be made based on the description set forth herein, without departing from the scope of the invention as set forth in the following claims.

What is claimed is:

1. A method comprising:
generating a count corresponding to a number of cycles of a ring oscillator;
generating a phase of the ring oscillator corresponding to a fractional cycle of the ring oscillator;
generating a delayed count that is a delayed version of the count corresponding to full cycles of the ring oscillator; and
using the count, the phase, and the delayed count to determine an aligned count that is aligned with the phase.

2. The method as recited in claim 1, further comprising;
receiving an analog signal at the ring oscillator to control a frequency of oscillation of the ring oscillator;
using the aligned count and the phase to generate a digital signal corresponding to the analog signal.

3. The method as recited in claim 1, further comprising;
comparing the count and the delayed count to determine if the count and the delayed count are equal.

4. The method as recited in claim 3, further comprising;
if the count equals the delayed count and if the phase is within a first range, determining the aligned count to be the count plus one;
if the count equals the delayed count and if the phase is not within the first range, determining the aligned count to be the count;
if the count is not equal to the delayed count and if the phase is within a second range, determining the aligned count to be the count minus one;
if the count is not equal to the delayed count and if the phase is not within the second range, determining the aligned count to be the count.

5. The method as recited in claim 4, wherein the first range is between 0 and not more than 90 degrees.

6. The method as recited in claim 5, wherein the second range is between at least 270 degrees and 0 degrees.

7. The method as recited in claim 4, wherein,
generating the count comprises using an output of one stage of the ring oscillator as a first clock signal for a counter; and
generating the delayed count comprises storing an output of the counter in a first storage using an output of another stage of the ring oscillator as a second clock signal.

8. The method as recited in claim 7, further comprising:
storing the output of the counter in a second storage using a third clock signal and storing an output of the first storage in a third storage using the third clock signal.

9. The method as recited in claim 8, further comprising:
comparing an output of the second storage to an output of the third storage to determine if the count and the delayed count are equal.

10. The method as recited in claim 8, further comprising:
storing the phase in a fourth storage using the third clock signal.

11. The method as recited in claim 4, wherein,
generating the count comprises using an output of one stage of the ring oscillator as a first clock signal for a counter; and
generating the delayed count comprises storing an output of the counter in a first storage using the first clock signal, the first storage being an opposite-edge sensitive storage device as compared to a clock edge or level to which the counter is sensitive.

12. The method as recited in claim 1, wherein generating the phase further comprises:
adjusting a sampled phase with a phase offset to generate the phase for use in determining the aligned count.

13. An analog to digital converter comprising:
a ring oscillator coupled to receive an analog signal to be converted to a digital signal, the analog signal coupled to control a frequency of oscillation of the ring oscillator;
a counter to supply a count of a number of cycles of the ring oscillator;
first storage coupled to the counter to store a delayed count;
second storage to store a phase of the ring oscillator responsive to a clock signal, the phase corresponding to a fractional cycle of the ring oscillator; and
alignment logic to generate an aligned count based on the count, the phase, and the delayed count.

14. The analog to digital converter as recited in claim 13, further comprising;
compare logic to compare the count and the delayed count to determine if the count and the delayed count are equal.

15. The analog to digital converter as recited in claim 14, wherein the alignment logic is configured to:
set the aligned count to be the count plus one if the count equals the delayed count and if the phase is within a first range;
set the aligned count to be the count if the count equals the delayed count and if the phase is not within the first range;
set the aligned count to be the count minus one if the count does not equal the delayed count and if the phase is within a second range; and
set the aligned count to be the count as if the count does not equal the delayed count and if the phase is not within the second range.

16. The analog to digital converter as recited in claim 15, wherein the first range is between 0 and not more than 90 degrees.

17. The analog to digital converter as recited in claim 15, wherein the second range is between at least 270 degrees and 0 degrees.

18. The analog to digital converter as recited in claim 13, further comprising:
an output of one stage of the ring oscillator coupled to the counter as a first clock signal; and
an output of another stage of the ring oscillator coupled to the first storage as a second clock signal.

19. The analog to digital converter as recited in claim 13, further comprising:
third storage coupled to store an output of the first storage responsive to the clock signal and supply the delayed count; and
fourth storage coupled to store an output of the counter responsive to the clock signal and supply the count.

20. The analog to digital converter as recited in claim 13, further comprising:
phase offset storage to store a phase offset; and
summing logic to add the phase offset to the phase and supply an adjusted phase for use in determining the aligned count value.

21. An apparatus comprising:
means for generating count information and phase information;
means for generating third information that is a delayed version of the count information;
means for comparing the count information and the third information and supplying a compare indication; and
means for aligning the count information and the phase information based on the phase information, the compare indication, and the count information.

* * * * *